United States Patent [19]

Suzuki et al.

[11] Patent Number: 4,558,241

[45] Date of Patent: Dec. 10, 1985

[54] SENSE AMPLIFIER

[75] Inventors: Yasuo Suzuki, Yokohama; Hiroshi Hirao; Yasuaki Suzuki, Both of Kawasaki, all of Japan

[73] Assignee: Fujitsu Limited, Kawasaki, Japan

[21] Appl. No.: 626,795

[22] Filed: Jul. 2, 1984

[30] Foreign Application Priority Data

Jun. 30, 1983 [JP] Japan ................. 58-118618

[51] Int. Cl.⁴ .............. H03K 5/24; H03K 3/356; G01R 19/165; G11C 11/06
[52] U.S. Cl. .................. 307/530; 307/279; 365/205
[58] Field of Search .......... 307/530, 355, 362, 279; 365/94, 103, 104, 205, 207, 208

[56] References Cited

U.S. PATENT DOCUMENTS

| 3,879,621 | 4/1975 | Cavaliere et al. | 307/530 |
|---|---|---|---|
| 4,007,381 | 2/1977 | Mohsen | 307/362 X |
| 4,169,233 | 9/1979 | Haraszti | 307/355 |
| 4,223,394 | 9/1980 | Pathak et al. | 307/530 X |
| 4,287,570 | 9/1981 | Stark | 307/530 X |
| 4,376,987 | 3/1983 | Hsia | 307/530 X |
| 4,412,143 | 10/1983 | Patella et al. | 307/362 X |
| 4,461,965 | 7/1984 | Chin | 307/355 X |
| 4,485,317 | 11/1984 | Davies, Jr. | 307/279 X |

FOREIGN PATENT DOCUMENTS 0056290 4/1983 Japan ................. 365/104

Primary Examiner—Larry N. Anagnos
Attorney, Agent, or Firm—Armstrong, Nikaido, Marmelstein & Kubovcik

[57] ABSTRACT

A flip-flop type sense amplifier for a semiconductor memory device is disclosed, the sense amplifier comprising a pair of CMOS inverters cross-coupled with each other to form a CMOS flip-flop circuit having a pair of buffer circuits, for receiving the read-out voltage signals from multi-level memory cells and a predetermined reference voltage, respectively, and a pair of switching circuits for inverting a power source voltage across the flip-flop circuit through common sources of the flip-flop circuit, in response to the transition between a stand-by sequence and a latching operating. The common source of the p-channel transistors of the CMOS flip-flop circuit is connected to a negative potential source, and the common source of the n-channel transistors is connected to a positive potential source during a stand-by sequence, and vice versa, during a latching operation. This unique potential supply method enhances operational speed of the sense amplifier. In a multi-level memory device, a plurality of the sense amplifiers are connected in parallel for the discrimination of the read-out signals changing in a range of a few volts.

2 Claims, 6 Drawing Figures

SENSE AMPLIFIER

BACKGROUND OF THE INVENTION

This invention relates to a sense amplifier for a semiconductor device, in particular, to a memory device for a multi-level memory in which each memory cell stores data represented by a plurality of binary bits.

A concept for multi-level memories has been proposed as a breakthrough in the capacity limitation problem of semiconductor memory devices. (Electronics, October, 1980, p. 39, ibid. June 30, 1982, p. 81, etc.). This technique increases the capacity of a memory device, having a constant chip size, without increasing integration density. Some four-level type memory devices have been put into practical application as ROMs (Read Only Memories). In the ROMs, the level of the read out signal from each memory cell is related to one of the four states (data) represented by two binary bits. This data is usually written as the difference in the conductivity of the MOS transistor forming a memory cell, during the manufacturing process of the memory device by altering the size of the gate area of each transistor. Therefore, the ROM is categorized as a mask ROM.

In the case of a four-level memory device, the level of each read-out signal is compared with three reference voltages, accordingly, it is necessary to have at least three sense amplifiers each of which receives one of the three different reference voltages. FIG. 1 is a partial circuit diagram of a four-level ROM device, showing a memory cell $M_C$ and a sensing circuit including a load circuit LOAD, a column select transistor $Q_C$, and three sense amplifiers, $SA_1$, $SA_2$ and $SA_3$, whose inputs are commonly connected to the data bus. In FIG. 1, $Q_{D1}$ is a transistor for discharging the bit line prior to the selection of column and row. As seen in FIG. 1, when the gate of LOAD is opened and the column select signal COL and row select signal ROW are respectively applied to each gate of the transistor $Q_C$ and the memory cell $M_C$, a readout signal of a specified level corresponding to the data stored in the memory cell $M_C$ is generated on the data bus and applied to the sense amplifiers $SA_1$, $SA_2$ and $SA_3$, simultaneously.

Sense amplifiers typically employed for memory devices are classified into two kinds; one is a type of differential amplifier, and the other comprises a flip-flop circuit. A sense amplifier of the former type for sensing a multiple bit ROM is disclosed in U.S. Pat. No. 4,287,570 for instance. In view of sensitivity, a sense amplifier of the flip-flop type is more advantageous than a differential amplifier type, however, it seems that no flip-flop type sense amplifier which can be used for a multi-level memory device has been disclosed. Though there are many disclosures of flip-flop type sense amplifiers for the use in RAMs (Random Access Memories), they can not be employed in multi-level memory devices, because of the following problem.

In a RAM, each input signal is two levels, and the sense amplifier is only required to discriminate read-out signals whose levels change within a narrow range such as about 1 volt below the power source voltage. On the other hand, in the four-level memory device, for example, three sense amplifiers must respond to four-level input signals over a range of a few voltage, and it is necessary to provide means to isolate each flip-flop type sense amplifier to function independently from the others. Further, the solutions for these problems formerly resulted in an increase in operational delay in the flip-flop type sense amplifiers, particularly in those for ROMs.

SUMMARY OF THE INVENTION

Therefore, it is the primary object of the present invention to provide a flip-flop type sense amplifier adaptable to a multi-level memory device, and particularly to a multi-level ROM device.

The sense amplifier of the present invention includes a flip-flop circuit comprising a pair of cross-coupled CMOS (Complementary Metal Oxide Semiconductor) inverters, a pair of input buffer circuits, each connected to the output node of each CMOS inverter forming the flip-flop circuit, and a pair of switching circuits, each comprising a CMOS inverter and connected to each common source of the flip-flop circuit through its output node. One buffer circuit receives multi-level read-out voltage signals from memory cells and provides output signals to the flip-flop circuit, while another buffer circuit receives a predetermined reference voltage and provides a reference signal to the flip-flop circuit. The CMOS switching circuits operate to invert the potential at the common sources of the p-channel transistors and the n-channel transistors of the flip-flop circuit, in response to the transition between stand-by sequence and latching operation. That is, the common source of the p-channel transistors is supplied with negative potential and that of the n-channel transistors is supplied with positive potential during the stand-by sequence, and vice versa during latching operation. This unique potential supply method enhances operational speed of a flip-flop circuit type sense amplifier.

Other and further objects, features and advantages of the present invention will appear more fully from the following description.

PREFERRED EMBODIMENT OF THE INVENTION

Figure 2:
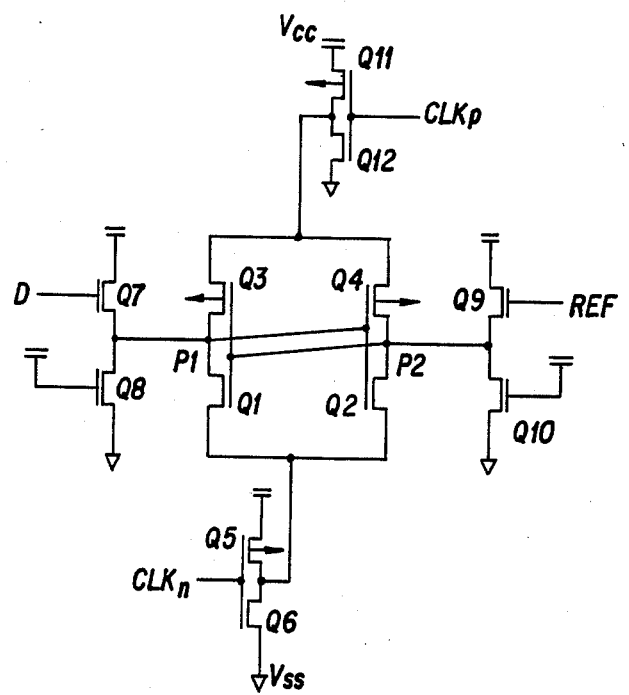
FIG. 2 is a circuit diagram embodying a sense amplifier of the present invention.

FIG. 2 is a circuit diagram a sense amplifier of the present invention. In FIG. 2, $Q_1$ and $Q_2$ are n-channel MOS transistors, and $Q_3$ and $Q_4$ (both attached with an arrowhead) are p-channel MOS transistors. Therefore each pair of $Q_1$ and $Q_3$, and $Q_2$ and $Q_4$ form a CMOS inverter. These CMOS inverters are cross-coupled to each other at their input terminals (common gate) and output terminals (nodes), and hence form a flip-flop circuit. Buffer circuits are coupled to the nodes $P_1$ and $P_2$ of the CMOS inverters, the first buffer circuit comprising n-channel MOS transistors $Q_7$ and $Q_8$, and the second buffer circuit comprising n-channel MOS transistors $Q_9$ and $Q_{10}$. The conduction channels in each pair of transistors $Q_7$ and $Q_8$ and transistors $Q_9$ and $Q_{10}$ are linked in series between a positive potential source ($V_{cc}$) and a negative potential source ($V_{ss}$), and the junction in each transistor pair is connected to each of the nodes $P_1$ and $P_2$, respectively. Therefore, the buffer circuits are formed in a source follower mode. The gate of the transistor $Q_7$ receives a read-out signal D, while the gate of the transistor $Q_9$ receives a reference voltage Ref. The transistors $Q_8$ and $Q_{10}$ are designed to have a relatively lower conductance (gm) as compared to that of the transistors $Q_7$ and $Q_9$, and hence the potentials at the nodes $P_1$ and $P_2$ change to be approximately equal to the level of the signals D and Ref, respectively, during the stand-by sequence (the period in which the flip-flop circuit is not activated to output a high logic level signal).

Figure 3:
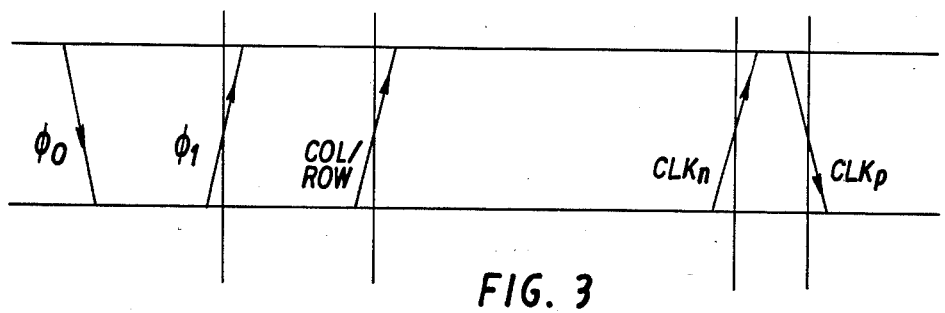
FIG. 3 is a schematic diagram showing the input timing of controlling pulses.

A pair of switching circuits are coupled to the common sources of the CMOS flip-flop, the first switching circuit comprising a p-channel MOS transistor $Q_5$ and an n-channel MOS transistor $Q_6$, and the second comprising a p-channel transistor $Q_{11}$ and n-channel transistor $Q_{12}$. Therefore, each of the switching circuits has a CMOS inverter configuration. The conduction channel of the CMOS inverter forming each switching circuit is connected between a positive potential source ($V_{cc}$) and a negative potential source ($V_{ss}$), and the common gate of the CMOS inverter forming the first switching circuit receives a first clock signal, $CLK_n$, and the common gate of the CMOS inverter forming the second switching circuit receives a second clock signal, $CLK_p$. The wave forms of the clock signals are shown in FIG. 3.

For sensing the read-out signal from a four-level memory cell, three sense amplifiers $SA_1$, $SA_2$ and $SA_3$ are used, each having the circuit configuration as shown in FIG. 2. Reference voltage signals $Ref_1$, $Ref_2$ and $Ref_3$ of different levels are respectively applied to each of the sense amplifiers. Due to the buffer circuit, each of the three sense amplifiers $SA_1$, $SA_2$ and $SA_3$, whose input terminals are connected commonly to the data bus, is isolated and can operate independently from the others. For instance, when the level of the read-out signal D and the levels of the reference signals $Ref_1$, $Ref_2$ and $Ref_3$ are in the following relation, the potential at the node $P_2$ of the sense amplifier $SA_1$ is raised to the level of the positive potential source $V_{cc}$ during latching operation.

$$Ref_1 > D > Ref_2 > Ref_3$$

However, since each node $P_1$ of the sense amplifiers $SA_2$ and $SA_3$ is isolated by the buffer circuit, the level at the node $P_2$ of each of the sense amplifiers $SA_2$ and $SA_3$ can be correctly lowered to the level of the negative potential source $V_{ss}$ (usually ground level) independent of the raising of the sense amplifier $SA_1$.

Thus, any multi-level read-out signal having a level in the range between the highest reference voltage $Ref_1$ and the lowest reference voltage $Ref_3$ can be discriminated. It is obvious that such a buffer circuit is unnecessary in the sense amplifier for an ordinary two-level memory device.

It is well known that a CMOS configuration can provide a circuit of low power dissipation, however, a further advantage of the CMOS is utilized in this invention. That is, a flip-flop circuit comprising CMOS inverters can operate to provide a full logic level output signal even when either of the potentials at the nodes $P_1$ and $P_2$ is higher than the threshold voltage $V_{th(p)}$ of the p-channel MOS transistors $Q_3$ and $Q_4$ or when both of the potentials at the nodes $P_1$ and $P_2$ are lower than the threshold voltage $V_{th(n)}$ of the n-channel MOS transistors $Q_1$ and $Q_2$. In FIG. 2, if the potential $V(P_1)$ at the node $P_1$ and the potential $(VP_2)$ at the node $P_2$ are in the following relation, for example, $$V_{th(n)} > V(P_2) \geqq V(P_1),$$

both of the n-channel MOS transistors $Q_1$ and $Q_2$ are initially in the OFF state. However, the positive feedback loop for amplifying the potential difference between the nodes $P_1$ and $P_2$ is maintained by the p-channel MOS transistors $Q_3$ and $Q_4$, hence the flip-flop circuit can operate to output full logic level signals. Similarly, the operation of the flip-flop circuit under a potential condition as such as $$V_{th(p)} < V(P_2) \leqq V(P_1),$$

for example, can also be accomplished by the positive feedback loop consisting of the n-channel MOS transistors $Q_1$ and $Q_2$. Therefore, the use of a CMOS flip-flop circuit eliminates the need for designing the flip-flop circuit of each sense amplifier individually to match the reference voltage input to the sense amplifier. That is, it is possible to fabricate the sense amplifiers $SA_1$, $SA_2$ and $SA_3$ to have identical circuit parameters, hence reducing cost and turn around time in the manufacturing.

Figure 1:
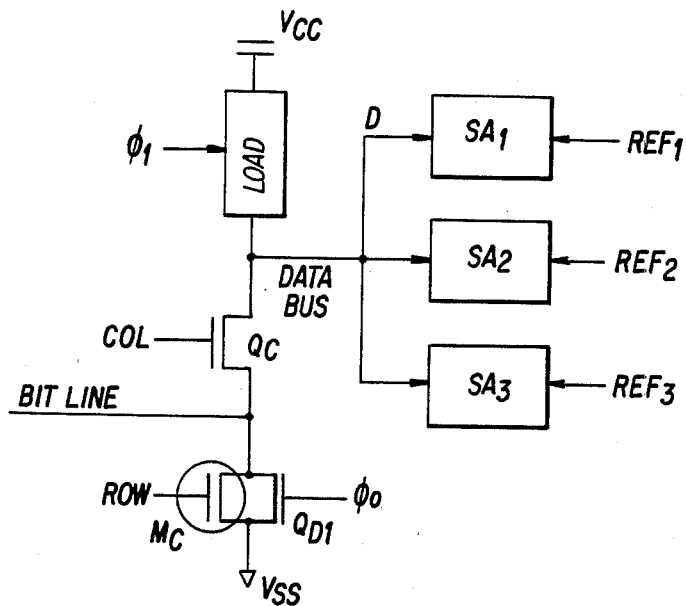
FIG. 1 is a circuit diagram showing a part of a four-level ROM.

The function of the CMOS switching circuits connected to each common source of the flip-flop circuit is explained in connection with the waveform of the read-out signal D and the potential change at the nodes $P_1$ and $P_2$. Referring to FIGS. 1 and 3, in the stand-by sequence, a control signal $\phi_o$ (which is for resetting the bit line to the ground level) switches to a low level, hence the memory cell $M_C$ is ready for operation, and then the gate of LOAD is opened by applying a control signal $\phi_1$. Subsequent to the above, when the column select signal COL and the row select signal ROW, which are respectively applied to the gates of the column select transistor $Q_C$ and the memory cell $M_C$, switch to a high level, a read-out signal D having a level corresponding to the conductance (gm) of the selected memory cell is generated on the bit line. At the same time, the reference voltage Ref, of each predetermined level, is generated in each of the three reference voltage signal generating circuits (not shown). The read-out signal D on the bit line is applied commonly through the data bus to the sense amplifiers $SA_1$, $SA_2$ and $SA_3$, while three reference voltages $Ref_1$, $Ref_2$ and $Ref_3$ are respectively applied to the sense amplifiers $SA_1$, $SA_2$ and $SA_3$.

Figure 4A:
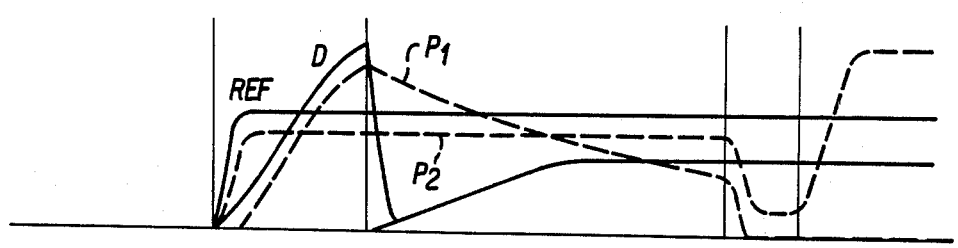
FIGS. 4(A) and 4(B) are schematic diagrams showing potential changes in a sense amplifier.
Figure 4B:
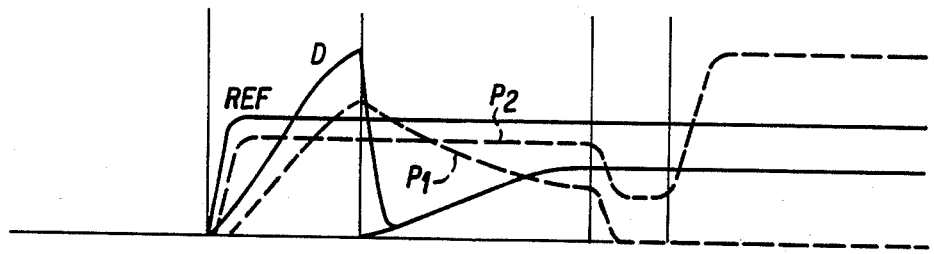

FIGS. 4(A) and 4(B) are schematic diagrams showing the waveforms of the read-out voltage signal D, the reference voltage Ref, and the potentials at the nodes $P_1$ and $P_2$ of the flip-flop circuit shown in FIG. 2. Referring to FIG. 1 and FIG. 4(A), when the gate of the LOAD connected to the data bus is opened by the control signal $\phi_1$, a steep rise of potential on the data bus occurs, as shown by the curve D in FIG. 4(A). On the other hand, when the column select transistor $Q_C$ is turned ON by the column select signal COL, the potential falls very sharply, and then tends to increase slowly to reach a steady level determined by the gm of the selected memory cell. This potential change in the curve D is because the difference in the parasitic capacity of the data bus is substantially small compared to that of the bit line, and accordingly, the time constant of the potential change on the data bus is small so long as the column select transistor $Q_C$ is OFF, but it becomes large after the column select transistor $Q_C$ turns ON. Thus, the potential on the data bus rises steeply up to a level approximately equal to the positive potential source $V_{cc}$. The potential fall occurring just after the turn on of the column select transistor $Q_C$ is because the bit line has been reset to ground level by the control signal $\phi_o$, as described above. Thus, the transient peak appears in the read-out voltage signal D. On the other hand, the potential change in the Ref is rather rapid and then Ref becomes constant as shown by the curve Ref in FIG. 4(A).

Potential change at the nodes $P_1$ and $P_2$ occurs as shown by the dashed line curves in the FIG. 4(A), in response to the changes of the read-out voltage signal D and the reference voltage Ref. The potential at the node $P_1$ rises sharply along with the rise of the potential D on the data bus, and reaches a level approximately equal to that of the D, (in the strict sense, $P_1$ is lower than D by $V_{th}$, the threshold voltage of the transistor $Q_7$ of the first buffer circuit: see FIG. 2), but it decreases rather slowly to reach a steady level. The potential at the node $P_2$ changes approximately in parallel with the curve of the reference voltage Ref and reaches a steady state level (the level at the node $P_2$ is lower than Ref by $V_{th}$, the threshold voltage of the transistor $Q_9$ of the second buffer circuit: see FIG. 2). The large time constant in the fall of the level at the node $P_1$ is due to the relatively large capacity attached to the node $P_1$ and small conductance (gm) of the bias transistor $Q_8$ forming the first buffer circuit.

In the course of reaching a steady state level, each of the curves representing the changes of the potentials at the nodes $P_1$ and $P_2$ cross each other, if the level of the read-out voltage signal D is lower than the level of the reference voltage Ref. The timing of the crossing depends on the heights of $P_1$ and $P_2$ at their steady state levels. For example, in the four-level memory device, the largest delay in the timing occurs in the sense amplifier $SA_3$ when the lowest level read-out signal is applied. Therefore, the time to initiate the latching operation of the flip-flop circuits can not be earlier than this largest delay.

However, in the sense amplifier of the present invention, earlier latching operation can be accomplished as follows. Referring to FIG. 2 and FIG. 3, the second clock signal $CLK_p$ is at a high level during the stand-by sequence, hence the transistor $Q_{12}$ in the CMOS inverter forming the second switching circuit is in the ON state, and the common source of the p-channel transistors $Q_3$ and $Q_4$ of the flip-flop circuit is connected to the negative potential souce $V_{ss}$. In this condition, the charge accumulated in the capacity attached to the node $P_1$, in response to the transient rise in the potential D, is discharged through the transistors $Q_3$ and $Q_{12}$ as long as the potential at the node $P_1$ is kept higher than the potential at the node $P_2$ by $V_{th(p)}$, the threshold voltage of the p-channel transistor $Q_3$. Consequently, the height of the transient peak in the potential change at the node $P_1$ is reduced, and further, the fall subsequent to the transient peak is accelerated, as shown in FIG. 4(B).

At the same time, the transistor $Q_5$ in the CMOS inverter forming the first switching circuit is in the ON state because the first clock signal $CLK_n$ is at a low level, hence the common source of the n-channel transistors $Q_1$ and $Q_2$ of the flip-flop circuit is connected to the positive potential source $V_{cc}$. In this condition, the charge-up of the capacity attached to the node $P_2$ is accelerated through the transistor $Q_2$ which is in the ON state as long as the potential at the node $P_1$ is kept higher than the potential at the node $P_2$ by $V_{th(n)}$, the threshold voltage of the n-channel transistor $Q_2$. (Note that, in this sequence, transistor $Q_1$ is in the OFF state.)

As the result of both acceleration in the discharge of the capacity attached to the node $P_1$ and in the charge-up of the capacity attached to the node $P_2$, the crossing time of the potentials at the nodes $P_1$ and $P_2$ is advanced, as shown in FIG. 4(B), and earlier initiation of the latching operation of the flip-flop circuit can be accomplished.

After the crossing, the first clock signal $CLK_n$ truns to a high level, hence, in the first switching circuit, transistor $Q_5$ is turned to the OFF state while transistor $Q_6$ is turned to the ON state. Subsequent to the change of the first clock signal $CLK_n$, the second clock signal $CLK_p$ switches to the low level, hence, in the second switching circuit, transistor $Q_{12}$ is turned to the OFF state while transistor $Q_{11}$ is turned to the ON state. Thus, the common source of the n-channel transistors $Q_1$ and $Q_2$ and that of the p-channel transistors $Q_3$ and $Q_4$ are respectively connected to negative potential source $V_{ss}$ and positive potential source $V_{cc}$, and the flip-flop circuit is latched to amplify the potential difference between the node $P_1$ and $P_2$ up to the full logic level. In the above operation, timing when the second clock signal $CLK_p$ switches to the low level may be the same as when the first clock signal $CLK_n$ switches to a high level, as long as it does not precede the latter.

Figure 5:
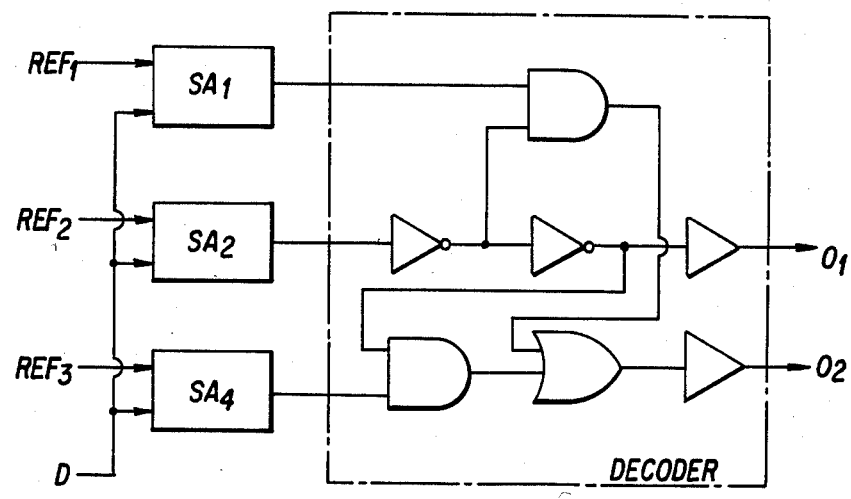
FIG. 5 is a circuit diagram of a decoder for converting output signals from three sense amplifiers into a two binary bits expression.

The full logic level signals are simultaneously applied from the three sense amplifiers to a decoder input as shown in FIG. 5 and processed to provide data represented by two binary bits. For instance, assuming that each sense amplifier outputs a signal "1" if the level of the read-out singal D is higher than the level of its reference voltage Ref, and "0" if the level of the signal D is lower than that of Ref, there may be four combinations of the output signals from the three sense amplifiers, i.e. 111, 110, 100 and 000. They are related to the four states each represented by two bits of binary, respectively, i.e. 11, 10, 01 and 00. The relation among the levels of the read-out signal D and the reference voltage Ref, the above combination of the output signals and the state represented by the two binary bits is summarized in the following.

| Read-out Signal | Output Signal | State |
|---|---|---|
| D > $Ref_1$ | 111 | 11 |
| $Ref_1$ > D > $Ref_2$ | 110 | 10 |
| $Ref_2$ > D > $Ref_3$ | 100 | 01 |
| $Ref_3$ > D | 000 | 00 |

As described in above embodiment, the flip-flop circuit in the present invention is not only kept inactive by the isolation of the common source of the p-channel transistors from the positive potential source during the stand-by sequence, but it is, meanwhile, powered to accelerate the change of the potential at the input/output nodes by implementing a means for supplying each common transistors with a respective inverted potential. Hence, the operational speed can be maintained high even in the sense amplifier for discriminating a read-out voltage signal of the lowest level in a multi-level ROM. In other words, sufficient potential difference is provided during the standby sequence, therefore, sensitivity of a flip-flop type sense amplifier can be improved without sacrifice of operational speed.

The many features and advantages of the present invention are apparent from the detailed specification, and thus, it is intended by the appended claims to cover all such features and advantages of the device which fall within the true spirit and scope of the invention. Further, since modifications and changes will readily occur to those skilled in the art, it is not desired to limit the invention to the exact construction and operation illustrated and described, and accordingly, all suitable modifications and equivalents may be resorted to, falling within the scope of the invention. For example, the above embodiment discloses the application to a multi-level ROM, however, the sense amplifier of the present invention can also be used in a ordinary two-level ROM or RAM.

We claim:

1. A sense amplifier comprising:
   a flip-flop circuit including two n-channel MOS transistors having a common source and two p-channel MOS transistors having a common source; said n-channel transistors and said p-channel transistors forming pairs, each pair having a conduction channel connected in series and having a common gate connected to the node of the opposite pair of said n-channel transistor and said p-channel transistor;
   a first switching circuit for switching the polarity of the potential supplied to said common source of said n-channel transistors of said flip-flop circuit;
   a second switching circuit for switching the polarity of the potential supplied to said common source of said p-channel transistors of said flip-flop circuit; wherein the polarity of the potential at the common sources is inverted in response to the transition between a stand-by sequence and a latching operation;
   a first buffer circuit including a pair of n-channel MOS transistors having conduction channels connected in series between a positive potential source and a negative potential source, the gate of one of said transistors receiving read-out voltage signals from memory cells and the gate of the other of said transistors being connected to the positive potential source, said transistors having a junction connected to a first of said nodes of said flip-flop circuit; and
   a second buffer circuit including a pair of n-channel MOS transistors having conduction channels connected in series between a positive potential source and a negative potential source, the gate of one of said transistors receiving a reference voltage and the gate of the other of said transistors being connected to the positive potential source, said transistors having a junction connected to a second of said nodes of said flip-flop circuit.

2. A sence amplifier as set forth in claim 1, wherein each of said first and second switching circuits comprises a CMOS inverter having a conduction channel connected between a positive potential source and a negative potential source, wherein said CMOS inverter comprising said first switching circuit comprises a gate for receiving a first clock signal and a junction connected to said common source of said n-channel transistors of said flip-flop circuit, and wherein said CMOS inverter comprising said second switching circuit comprises a gate for receiving a second clock signal and a junction connected to said common source of said p-channel transistors of said flip-flop circuit.

* * * * *